(12) United States Patent
Chee

(10) Patent No.: US 7,005,321 B2
(45) Date of Patent: Feb. 28, 2006

(54) STRESS-COMPENSATION LAYERS IN CONTACT ARRAYS, AND PROCESSES OF MAKING SAME

(75) Inventor: Choong Kooi Chee, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/815,542

(22) Filed: Mar. 31, 2004

(65) Prior Publication Data

US 2005/0221532 A1   Oct. 6, 2005

(51) Int. Cl.
*H01L 21/48* (2006.01)

(52) U.S. Cl. .................................... 438/108; 438/127
(58) Field of Classification Search ............... 438/106, 438/108, 112, 117, 124, 126, 127
See application file for complete search history.

(56) References Cited

U.S. PATENT DOCUMENTS

| 6,429,043 B1 * | 8/2002 | Nakazawa et al. ........... 438/106 |
| 6,518,093 B1 * | 2/2003 | Nakamikawa ............... 438/108 |
| 6,716,665 B1 * | 4/2004 | Baba et al. .................. 438/106 |
| 6,897,096 B1 * | 5/2005 | Cobbley et al. ............. 438/123 |

* cited by examiner

*Primary Examiner*—Scott Geyer
(74) *Attorney, Agent, or Firm*—Schwegman, Lundberg, Woessner & Kluth, P.A.

(57) ABSTRACT

A stress-compensation layer is formed by pressing a solder bump into a compressible film within a mold chase. The stress-compensation layer flows against the solder bump and the compressible film such that at least a portion of the solder ball is embedded in the stress-compensation layer. The compressible film is removed to reveal at least a portion of the solder bump exposed and free of the stress-compensation layer. An article that exhibits a stress-compensation layer with a surface characteristic of the imposed flexible film is also included. A computing system that includes a stress-compensation layer with a surface characteristic of the imposed flexible film is also included.

29 Claims, 8 Drawing Sheets

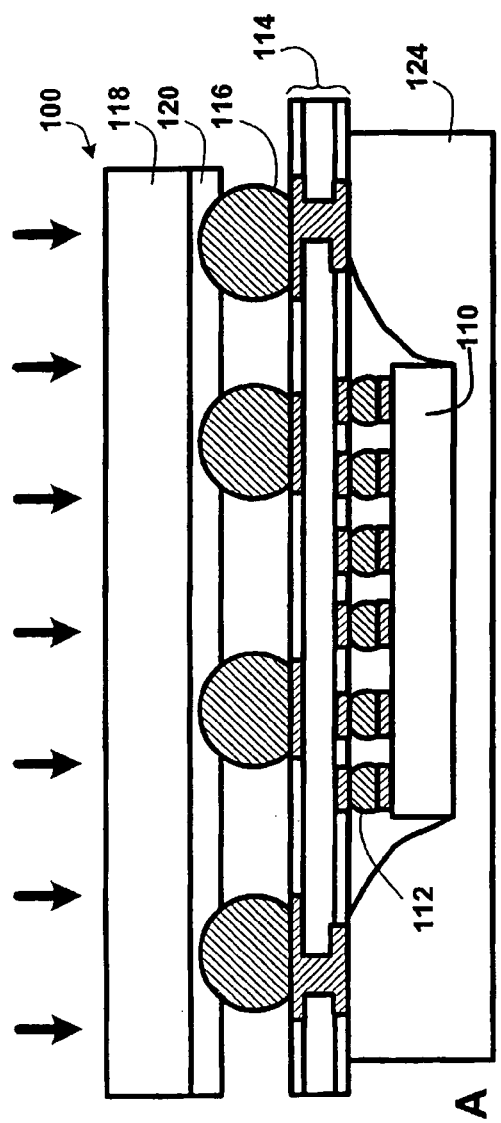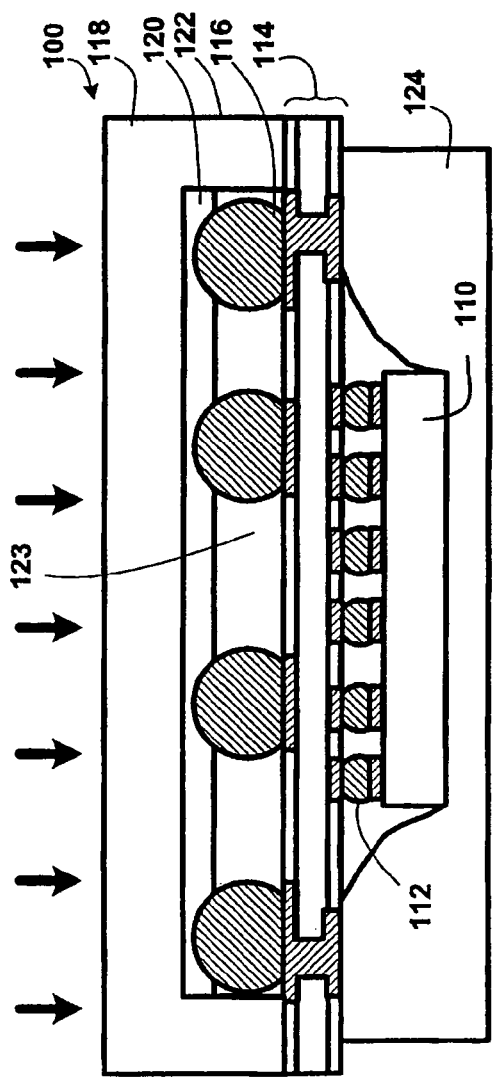

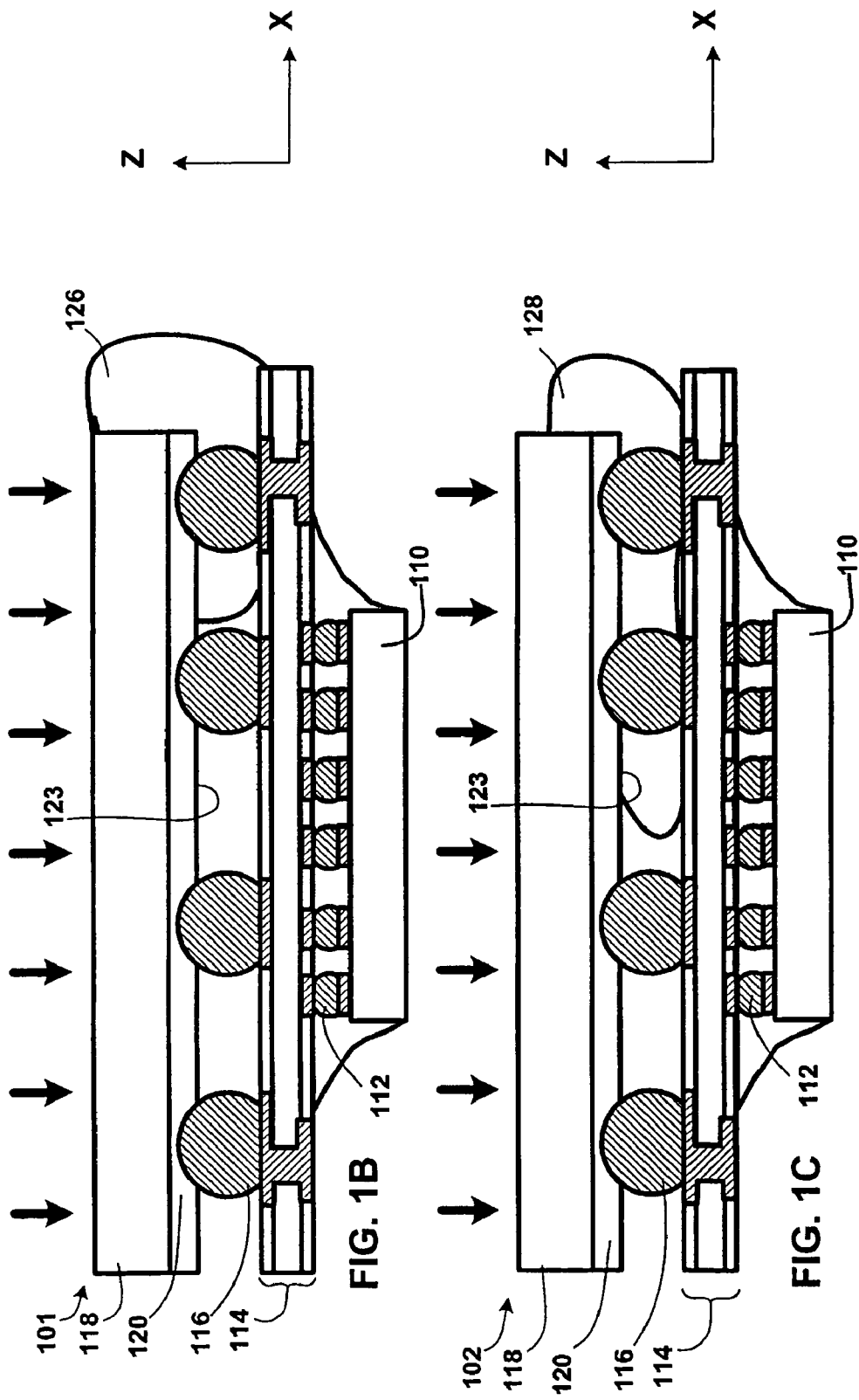

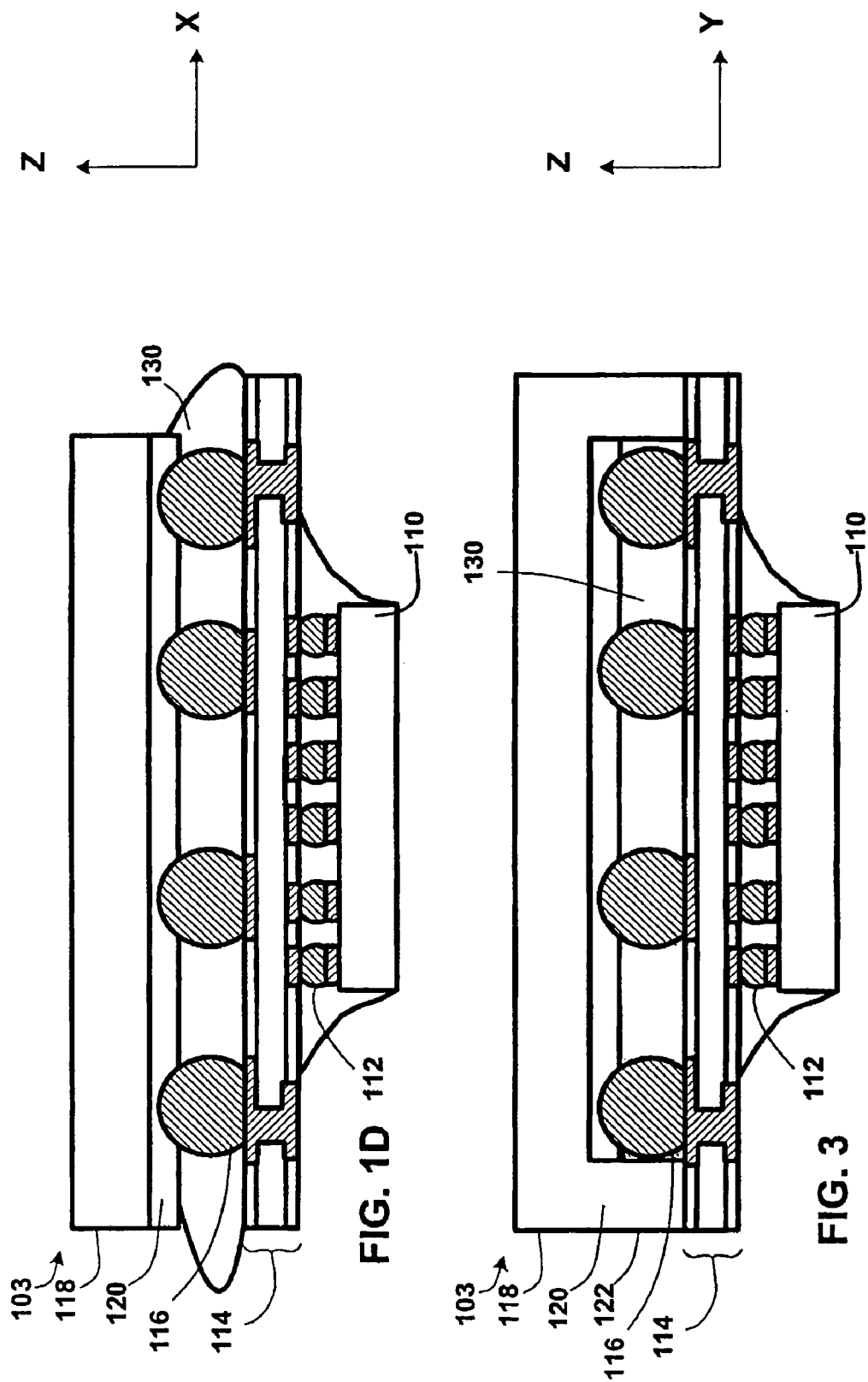

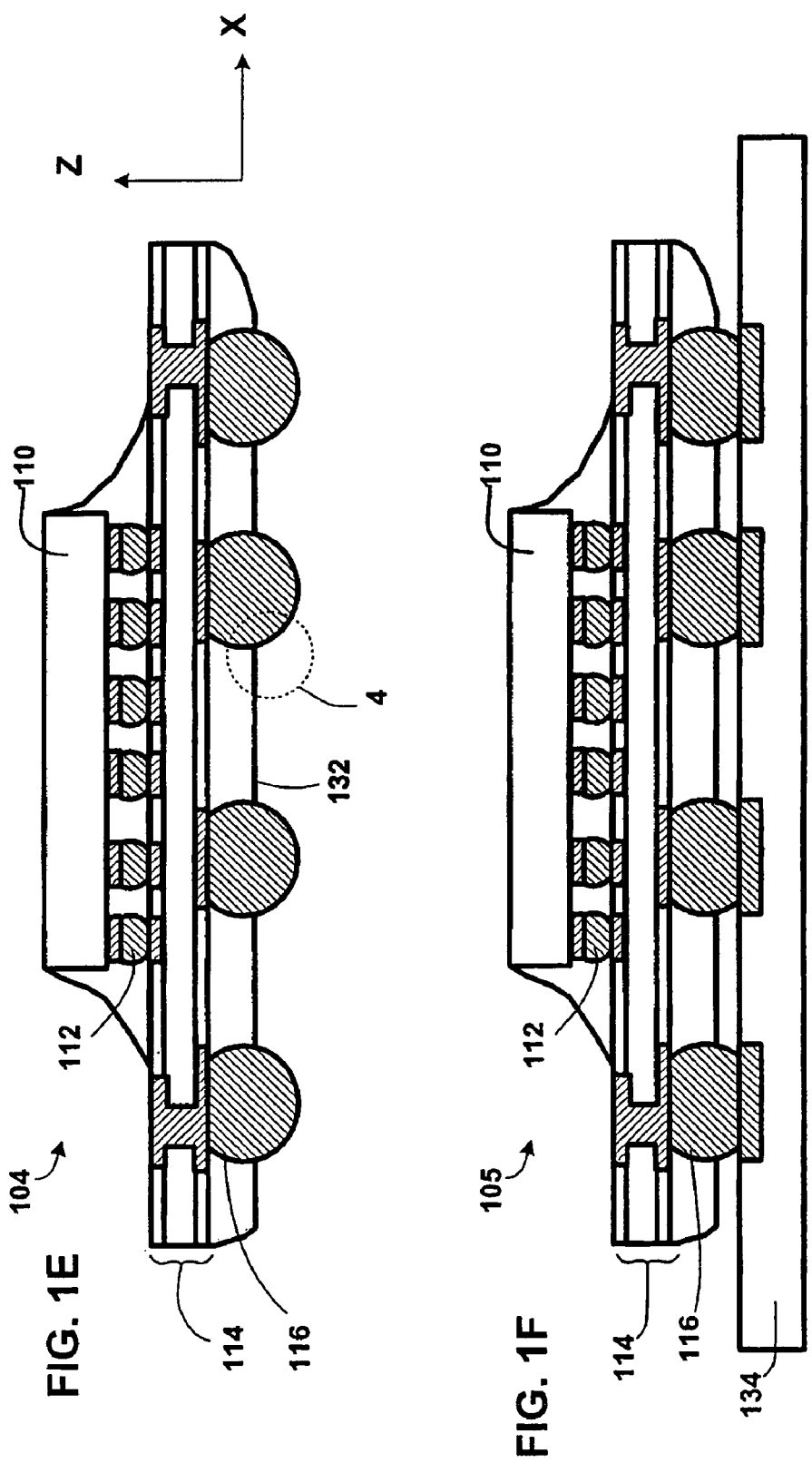

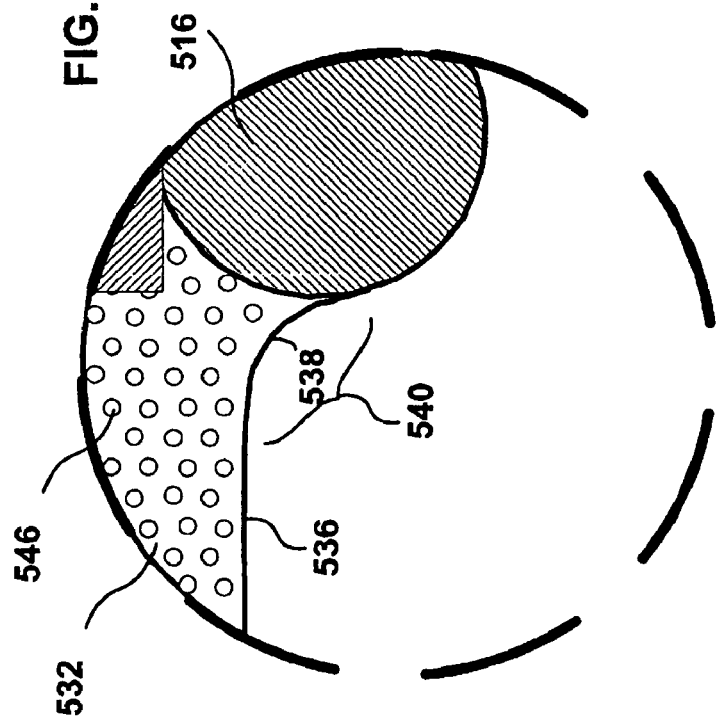
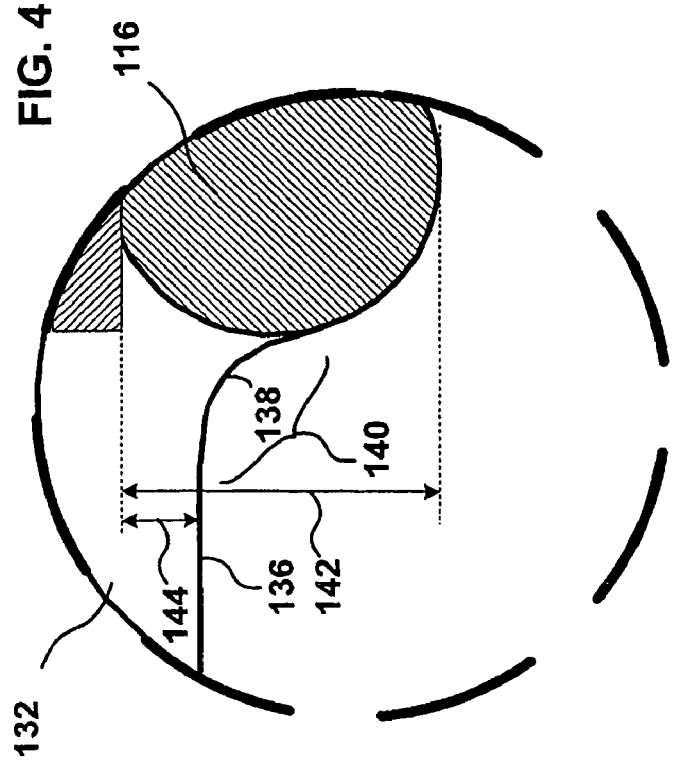

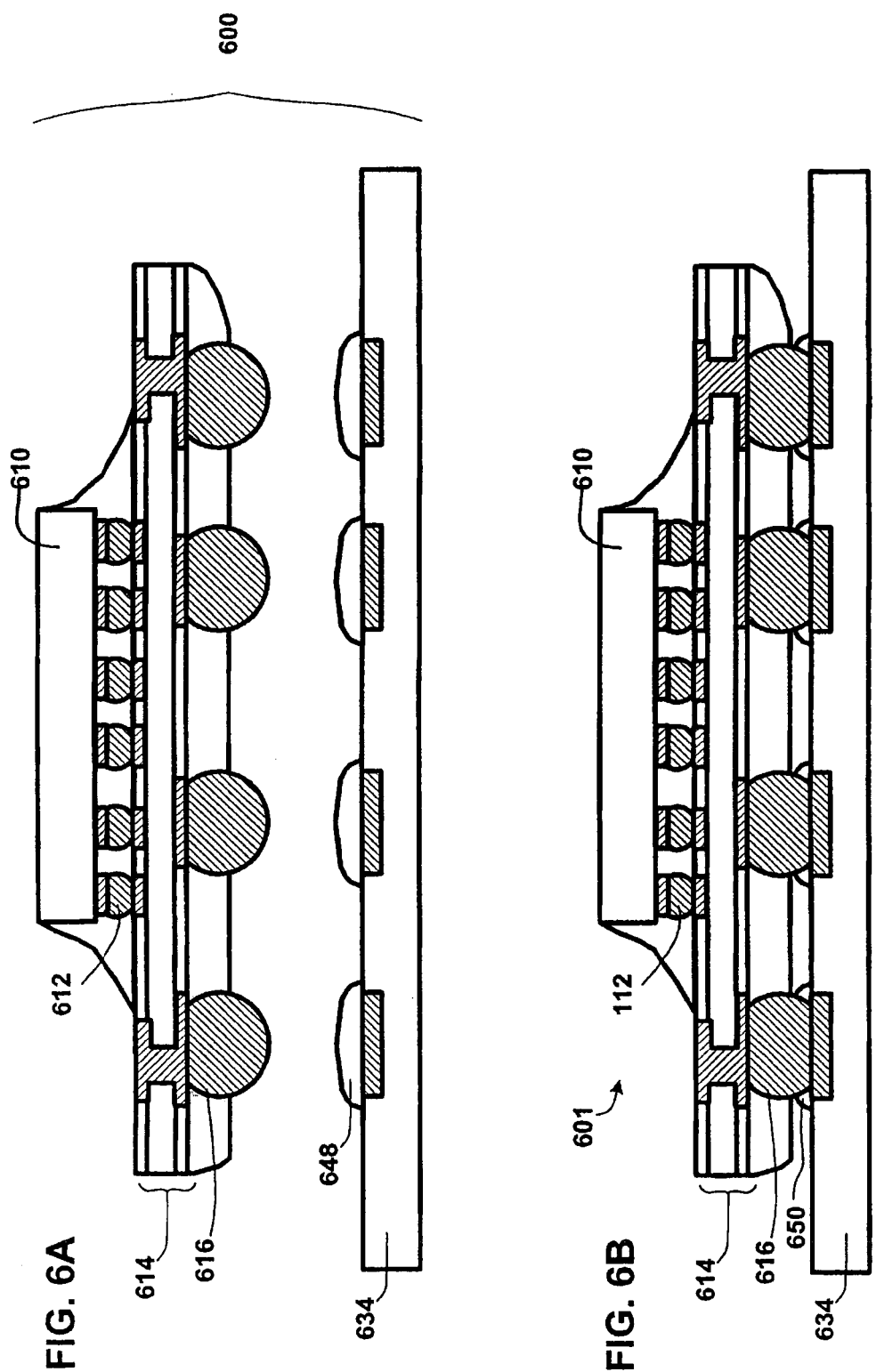

STRESS-COMPENSATION LAYERS IN CONTACT ARRAYS, AND PROCESSES OF MAKING SAME

TECHNICAL FIELD

Disclosed embodiments relate to a stress-compensation layer in a microelectronic device package. The stress-compensation layer assists in preventing thermal mismatch and creep failures in microelectronic device packages.

BACKGROUND INFORMATION

Chip packaging is often intensely involved with heat removal. Thermal expansion-mismatch challenges exist between the die, the underfill material, and the substrate to which the die is mounted. The thermal mismatch often is exhibited at the joint of a solder bump and a bond pad.

One method of dealing with solder bump stress is to encapsulate the solder bumps at the corners with an underfill layer. This method only encapsulates solder bumps at the periphery of the package. It does not encapsulate the solder bumps at the center of the component.

With the dispensing and printing of stress-compensation layer materials on the package among the array of solder bumps, solder bump contamination is a concern.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1A is a cross-section elevation of a chip package during processing according to an embodiment;

FIG. 1B is a cross-section elevation of the chip package depicted in FIG. 1A during further processing according to an embodiment;

FIG. 1C is a cross-section elevation of the chip package depicted in FIG. 1B during further processing according to an embodiment;

FIG. 1D is a cross-section elevation of the chip package depicted in FIG. 1C during further processing according to an embodiment;

FIG. 1E is a cross-section elevation of the chip package depicted in FIG. 1D during further processing according to an embodiment;

FIG. 1F is a cross-section elevation of the chip package depicted in FIG. 1E during further processing according to an embodiment;

FIG. 2 is a cross-section elevation of the chip package depicted in FIG. 1A when viewed orthogonal to the illustration in FIG. 1A;

FIG. 3 is a cross-section elevation of the chip package depicted in FIG. 1D when viewed orthogonal to the illustration in FIG. 1D;

FIG. 4 is a detail section taken from FIG. 1E according to an embodiment;

FIG. 5 is a detail section taken from FIG. 1E according to an embodiment;

FIG. 6A is a cross-section elevation of a chip package during processing according to an embodiment;

FIG. 6B is a cross-section elevation of the chip package depicted in FIG. 6A during further processing according to an embodiment;

DETAILED DESCRIPTION

Figure 7:
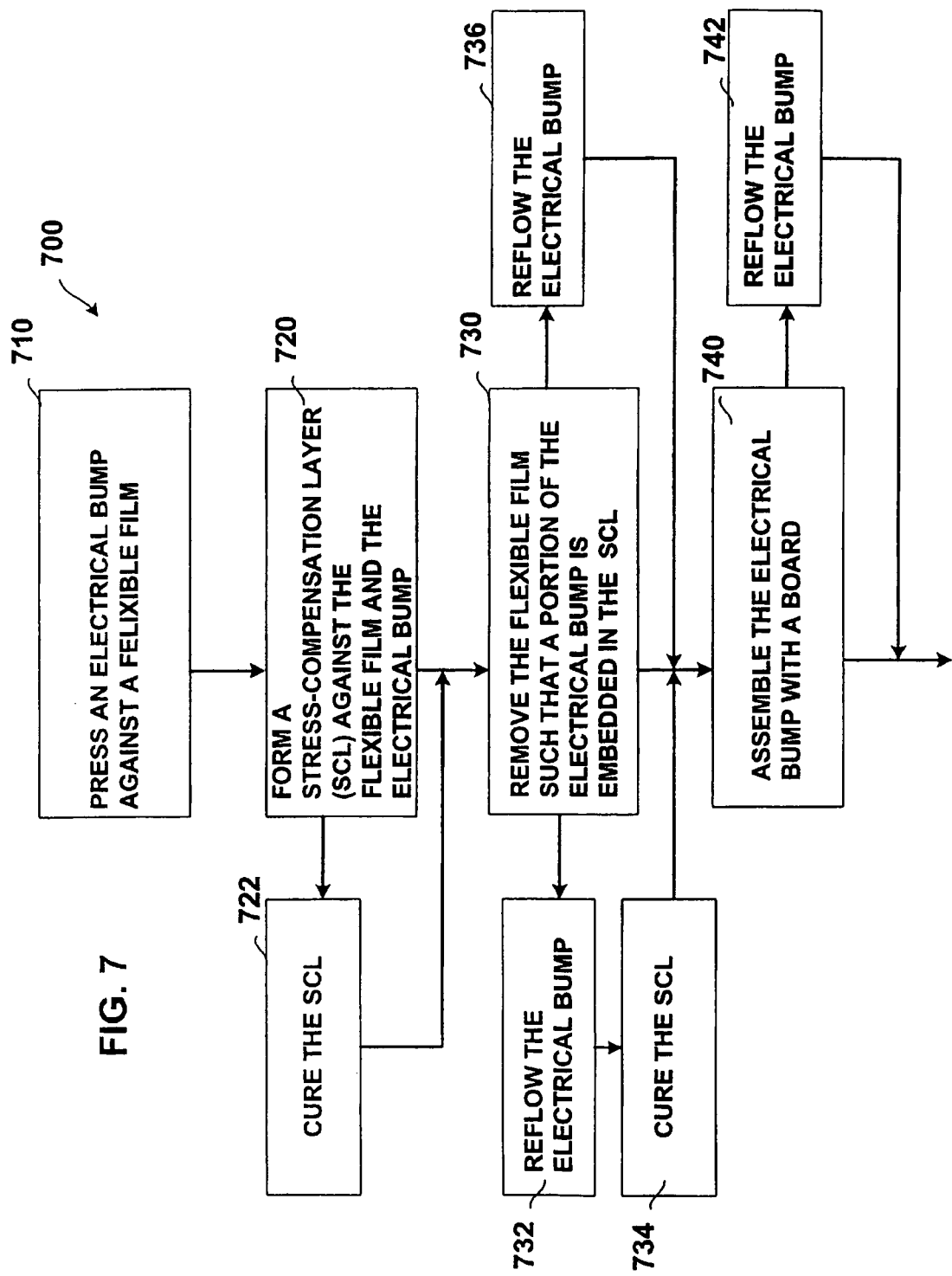
FIG. 7 is a process flow diagram according to an embodiment.

The following description includes terms, such as upper, lower, first, second, etc. that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A board is typically a conductor-overlay structure that is insulated and that acts as a mounting substrate for the die. A board is usually singulated from a board array. A die is usually singulated from a wafer, and wafers may be made of semiconducting, non-semiconducting, or combinations of semiconducting and non-semiconducting materials.

A "solder bump" or "electrical bump" is understood to be a unit of electrically conductive material such as a tin-lead solder, a tin-indium solder, a tin-bismuth solder, a tin-silver solder, a tin-copper solder, or other solders that are used in the microelectronic arts. The terms "solder bump" and "electrical bump" can be used interchangeably. Additionally a copper interconnect can be used, as well as other non-solder types of interconnects such as pins.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. The embodiment may be referred to, individually and/or collectively, herein by the term, "invention" merely for convenience and without intending to voluntarily limit the scope of this disclosure to any single invention or inventive concept if more than one is in fact disclosed. Additional structures known in the art have not been included to maintain the clarity of the drawings.

FIG. 1A is a cross-section elevation of a chip package 100 during processing according to an embodiment. In an embodiment, the chip package 100 includes chip-scale packaging dimensions. By "chip-scale packaging dimensions", it is meant that the footprint of the chip package 100 is in a range from about 80% the largest characteristic dimension of a microelectronic die, to about 200% the largest characteristic dimension of the die. Where the chip package 100 is substantially square, the largest characteristic dimension is an edge of the chip package 100.

The chip package 100 includes a die 110 that is coupled through a plurality of first solder bumps, one of which is designated with the reference numeral 112. Although only six first solder bumps 112 are depicted, they are a reduced number according to an embodiment for clarity of illustration. The first solder bump 112 couples the die 110 to a substrate 114, which is depicted as a laminated structure. The first solder bump 112 is disposed on the die side of the substrate 114. In an embodiment, the substrate 114 is a second level substrate such as an interposer for a processor. In an embodiment, the substrate 114 is part of a printed wiring board (PWB) such as a main board. In an embodiment, the substrate 114 is part of a mezzanine PWB. In an embodiment, the substrate 114 is part of an expansion card PWB. In an embodiment, the substrate 114 is part of a small PWB such as a board for a handheld device such as a cell phone or a personal digital assistant (PDA).

In an embodiment the chip package 100 is also bumped on the land side of the substrate 114 by a plurality of second solder bumps, one of which is designated with the reference numeral 116. Although only four second solder bumps 116 are depicted, they are a reduced number according to an embodiment for clarity of illustration.

In a process embodiment, a press plate 118 is forced against the plurality of second solder bumps 118. In an embodiment, a film 120 is disposed on the same side of the press plate 118 as the plurality of second solder bumps 116. In an embodiment, the film 120 is compressible such that pressure, depicted by the downward vertical arrows, causes the plurality of second solder bumps 116 to impress the film 120 and thereby become at least partially embedded into the film 120. In an embodiment, a jig 124 is supplied to assist in allowing a substantially uniform pressure distribution across the substrate 114 during use of the press plate 118 and to prevent damaging compressive stresses in the chip package 100, particularly in the die 110.

FIG. 2 is a cross-section elevation of the chip package 100 depicted in FIG. 1A when viewed orthogonal to the illustration in FIG. 1A. Where the chip package 100 depicted in FIG. 1A is displayed in the X-Z plane, in FIG. 2, the chip package 100 depicted in FIG. 1A is displayed in the Y-Z plane. The press plate 118 in FIG. 2 also illustrates a plate extension 122 that causes the space between the film 120 and the substrate 114 to become a mold chase 123.

FIG. 1B is a cross-section elevation of the chip package 100 depicted in FIG. 1A during further processing according to an embodiment. The chip package 101 is being processed by directing an underfill material 126 into the mold chase 123 and to contact the second electrical bump 116, the film 120, and the substrate 114. Because the second electrical bump 116 is partially embedded in the film 120, the underfill material 126 does not completely enclose the second electrical bump 116.

Various materials are used as the underfill material 126, including resins according to an embodiment. In an embodiment, an epoxy is used. In an embodiment, a cyanate ester composition or the like is used. In an embodiment, a polyimide composition or the like is used. In an embodiment, a polybenzoxazole composition or the like is used. In an embodiment, a polybenzimidazole composition or the like is used. In an embodiment, a polybenzothiazole composition or the like is used. In an embodiment, a combination of any two of the compositions is used. In an embodiment, a combination of any three of the compositions is used. In an embodiment, a combination of any four of the compositions is used. In an embodiment, a combination of any five of the compositions is used. Other polymer compositions can be used as the underfill material.

FIG. 1C is a cross-section elevation of the chip package 101 depicted in FIG. 1B during further processing according to an embodiment. As the underfill material 128 (126 in FIG. 1B) becomes larger in volume and continues to flow between the film 120 and the substrate 114, pressure continues to be applied by the press plate 118.

FIG. 1D is a cross-section elevation of the chip package 102 depicted in FIG. 1C during further processing according to an embodiment. The chip package 103 depicts the press plate 118 still holding the film 120 over the underfill material 128 (130 in FIG. 1C). As the underfill material 128 flows completely across the film 120 and the substrate 114 the underfill material 128 becomes a stress-compensation layer precursor 130 that partially encapsulates the electrical second bump 116.

FIG. 3 is a cross-section elevation of the chip package 103 depicted in FIG. 1D when viewed orthogonal to the illustration in FIG. 1D. The mold chase 123 is depicted as completely filled such that the stress-compensation layer precursor 130 has been channeled therewithin. After directing the stress-compensation layer precursor 130 into the mold chase 123, the stress-compensation layer precursor 130 can be cured. In an embodiment, the stress-compensation layer precursor 130 is partially cured sufficient to cause a portion of the stress-compensation layer precursor 130 to harden in order to facilitate removal of the press plate 118 without significantly distorting the stress-compensation layer precursor 130.

In an embodiment the film 120 is a tacky film that effects a release action, losing its substantial tackiness, upon heating. In an embodiment, the heating environment is accomplished by applying heat through the press plate 118, or by including heating elements in the press plate 118. By heating the film 120, if it is a tacky film, heating causes the film 120 to release, and simultaneously a portion of the stress-compensation layer precursor 130 to cure sufficient to resist distortion.

Tacky film materials such as No. 3195VS film from Lockwood Industries, of Canoga Park, Calif., are currently used for heat-releasable applications and are known in the art. Conditions that cause the tacky film 120 to release from the chip package 103 depend upon the specific tacky film, or when the film 120 is not a tacky film, conditions that cause the film 120 to no longer adhere to the stress-compensation layer precursor 130 can be ascertained by routine tests.

FIG. 1E is a cross-section elevation of the chip package 103 depicted in FIG. 1D during further processing according to an embodiment. The chip package 104 has been inverted with respect to its presentation in FIG. 1D. In an embodiment, the stress-compensation layer precursor 130 (FIG. 1D) has been further cured such that it is a cured stress-compensation layer 132. In an embodiment, the stress-compensation layer precursor 130 is not further cured until later in the processing flow.

FIG. 4 is a detail section 4—4 taken from FIG. 1E according to an embodiment. The detail section 4—4 illustrates the topology of the chip package 105 at an occurrence of a second solder bump 116 and the cured stress-compensation layer 132. Various metrics can be used to quantify the resulting structure that includes the second solder bump 116 in relation to the cured stress-compensation layer 132. The cured stress-compensation layer 132 includes a distal surface 136 and a fillet surface 138. The fillet surface 138 is disposed between the distal surface 136 and the second solder bump 116. Together, the distal surface 136 and the fillet surface 138 make up the free surface of the cured stress-compensation layer 132. The second solder bump 116 includes a major vertical characteristic dimension 142. The distal surface 136 of the cured stress-compensation layer 132 has a height 144 above the bottom of the second solder bump 116 that is a fraction of the major vertical characteristic dimension 142 of the second solder bump 116.

In an embodiment, the combination of the distal surface 136 and the fillet surface 138 of the cured stress-compensation layer 132 exhibit a surface profile that is characteristic of the imposed film 120 (FIG. 1E). Accordingly, where the imposed film 120 has absorbed about half of the second solder bump 116 by compression, the surface profile exhibits both the distal surface 136 and the fillet surface 138. Where the imposed film 120 has absorbed about one third (as approximately depicted in FIG. 4) of the second solder bump 116 by compression, the fillet surface 138 has an arc length 140 that is characteristic of the flexibility and the compressibility of the imposed film 120 in relation to the amount of pressure that was imposed by the press plate 118. Accordingly, where a ball-grid array with a cured stress-compensation layer 132 is scrutinized according to this disclosure, an undulating surface is detectible that includes both the cured stress-compensation layer 132 and a plurality of second electrical bumps 116 at the distal surface 136 and the fillet surface 138.

In an embodiment, the amount of the second electrical bump 116 that is exposed is about seven-eighths or greater, measured by the height 144, divided by the major vertical characteristic dimension 142. In an embodiment, the amount is about 90% In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

FIG. 5 is a detail section 4 taken from FIG. 1E according to an embodiment. The detail section 4 illustrates the topology of a chip package at an occurrence of a second solder bump 516 and a cured stress-compensation layer 532. The chip package includes the solder bump 516 and the cured stress-compensation layer 532. The cured stress-compensation layer 532 includes a distal surface 536 and a fillet surface 538. The fillet surface 538 has an arc length 540 that is characteristic of the flexibility and the compressibility of an imposed film according to the various embodiments set forth in this disclosure.

Additionally, the cured stress-compensation layer 532 is filled with a particulate 546 that assists the cured stress-compensation layer 532 to have a coefficient of thermal expansion (CTE) that facilitates a lower thermal mismatch between neighboring structures. In an embodiment, the particulate 546 is silica or the like. In an embodiment, the particulate 546 is ceria or the like. In an embodiment, the particulate 546 is zirconia or the like. In an embodiment, the particulate 546 is thoria or the like. In an embodiment, the particulate 546 is a combination of two or more particulates. Other dielectric particulates 546 may be used. In an embodiment, the particulate 546 is present in a range from about 1 percent to about one-half or greater the total weight of the cured stress-compensation layer 532. In an embodiment, the particulate 546 is in a range from about 2 percent to about 90 percent. In an embodiment, the particulate 546 is in a range from about 20 percent to about 85 percent. In an embodiment, the particulate 546 is in a range from about 40 percent to about 80 percent. In an embodiment, the particulate 546 is in a range from about 60 percent to about 80 percent.

FIG. 1F is a cross-section elevation of the chip package 104 depicted in FIG. 1D during further processing according to an embodiment. Where the chip package 105 is to be mounted upon a board 134 such as a motherboard, the second solder bumps 116 are mated to the board 134 and reflowed.

Heating of the package can be carried out in a curing oven under conditions to cause the tacky solder bumps 112, 116 to reflow. After reflow, this heating scheme is carried out to cure the stress-compensation layer 132 if it has not yet been fully cured. In an embodiment, heating includes a first temperature ramp from the ambient, to a temperature range from about 100° C. to about 140° C. Next, a temperature hold is maintained at a temperature in this range. The temperature hold may be from about 10 seconds to about 30 minutes. The first temperature hold achieves a further cure the stress-compensation layer 132. Thereafter, ambient cooling of the chip package 105 may be done.

FIG. 6A is a cross-section elevation of a chip package 600 during processing according to an embodiment. The chip package 600 includes a die 610 that is coupled through a plurality of first solder bumps, one of which is designated with the reference numeral 612. Although only six first solder bumps 612 are depicted, they are a reduced number according to an embodiment for clarity of illustration. The first solder bump 612 couples the die 610 to a substrate 614, which is depicted as a laminated structure. The first solder bump 612 is disposed on the die side of the substrate 614. In an embodiment, the substrate 614 is a second level substrate such as an interposer for a processor. In an embodiment, the substrate 614 is part of a printed wiring board (PWB) such as a main board. In an embodiment, the substrate 614 is part of a mezzanine PWB. In an embodiment, the substrate 614 is part of an expansion card PWB. In an embodiment, the substrate 614 is part of a small PWB such as a board for a handheld device such as a cell phone or a personal digital assistant (PDA).

In an embodiment the chip package 600 is also bumped on the land side of the substrate 614 by a plurality of second solder bumps, one of which is designated with the reference numeral 616. Although only four second solder bumps 616 are depicted, they are a reduced number according to an embodiment for clarity of illustration. The chip package 600 also includes a stress-compensation layer 632.

In FIG. 6A, the chip package 600 is to be mounted upon a board 634 such as a motherboard. In an embodiment, the board 634 is prepared with a plurality of uncured polymer spots, one of which is reference with the reference numeral 648.

FIG. 6B is a cross-section elevation of the chip package 600 depicted in FIG. 6A during further processing according to an embodiment. The chip package 600 has been mated by assembling the die 610 and the substrate 614 onto which it is mounted, with the board 634. Assembly has been accomplished by pushing the second solder bumps 616 through the uncured polymer spots 648. Thereafter, the uncured polymer spots 648 and the stress-compensation layer 632 (if it has not yet been processed) are cured by any curing process that is appropriate for the specific materials selected for the stress-compensation layer 632 and the cured polymer spots 650. Previous to, following, or simultaneously with curing the stress-compensation layer 632, reflowing of the solder bumps 612 and 616 is accomplished.

FIG. 7 is a process flow diagram 700 according to an embodiment.

At 710, the process includes pressing an electrical bump against a flexible film.

At 720, the process includes forming a stress-compensation layer against the flexible film and the electrical bump. In an embodiment, the process flow is completed at 720.

At 722, the process flow includes curing the stress-compensation layer. In an embodiment, the process flow is completed at 722.

At 730, the process flow includes removing the flexible film such that a portion of the electrical bump is embedded in the stress-compensation layer. In an embodiment, the process flow is completed at 730.

At 732, the process flow includes reflowing the electrical bump. In an embodiment, the process flow is completed at 732.

At 734, the process flow includes curing the stress-compensation layer. In an embodiment, the process flow is completed at 734.

At 736, the process flow includes reflowing the electrical bump. In an embodiment, the process flow is completed at 736.

At 740, the process flow includes assembling the electrical bump with a board. By way of non-limiting example, the board 634 is coupled to the die 610 by mating the second solder bump 116 with the board. In an embodiment, the process flow is completed at 740.

At 742, the process flow includes reflowing the electrical bump. In an embodiment, the process flow is completed at 742.

Figure 8:
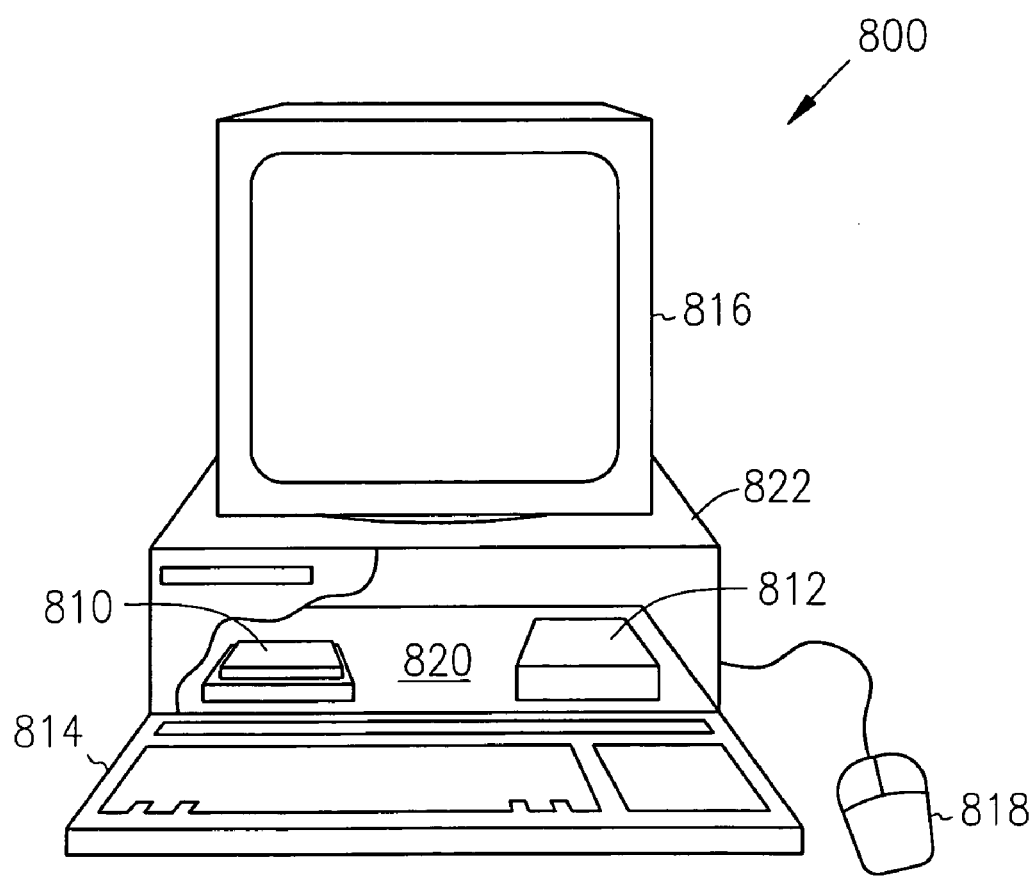
FIG. 8 is a depiction of a computing system according to an embodiment.

FIG. 8 is a depiction of a computing system 800 according to an embodiment. The computing system 800 includes a cured polymer surface of a stress-compensation layer configuration according to an embodiment. One or more of the foregoing embodiments of the stress-compensation layer configuration may be utilized in a computing system, such as a computing system 800 of FIG. 8. The computing system 800 includes at least one processor (not pictured), which is enclosed in a package 810 that is mounted on a board 820. Additionally the computing system 800 can include a data storage system 812, at least one input device such as keyboard 814, and at least one output device such as monitor 816, for example. The computing system 800 includes a processor that processes data signals, and may include, for example, a microprocessor, available from Intel Corporation. In addition to the keyboard 814, the computing system 800 can include another user input device such as a mouse 818, for example. Additionally, the computing system 800 includes a housing 822. As depicted, the housing 822 is a shell for a desktop computer. Other housing embodiments are applicable depending upon the specific computing system.

For purposes of this disclosure, a computing system 800 embodying components in accordance with the claimed subject matter may include any system that utilizes a microelectronic device system, which may include, for example, a stress-compensation layer configuration that is coupled to data storage such as dynamic random access memory (DRAM), polymer memory, flash memory, and phase-change memory. In this embodiment, the stress-compensation layer configuration is coupled to any combination of these functionalities by being coupled to a processor. In an embodiment, however, a stress-compensation layer configuration set forth in this disclosure is coupled to any of these functionalities. For an example embodiment, data storage includes an embedded DRAM cache on a die. Additionally in an embodiment, the stress-compensation layer configuration that is coupled to the processor (not pictured) is part of the system with a stress-compensation layer configuration that is coupled to the data storage of the DRAM cache. Additionally in an embodiment, a stress-compensation layer configuration is coupled to the data storage 812.

In an embodiment, the computing system can also include a die that contains a digital signal processor (DSP), a micro controller, an application specific integrated circuit (ASIC), or a microprocessor. In this embodiment, the stress-compensation layer configuration is coupled to any combination of these functionalities by being coupled to a processor. For an example embodiment, a DSP (not pictured) is part of a chipset that may include a stand-alone processor (in package 810) and the DSP as separate parts of the chipset. In this embodiment, an stress-compensation layer configuration is coupled to the DSP, and a separate stress-compensation layer configuration may be present that is coupled to the processor in package 810. Additionally in an embodiment, a stress-compensation layer configuration is coupled to a DSP that is mounted on the same board as the package 810.

It can now be appreciated that embodiments set forth in this disclosure can be applied to devices and apparatuses other than a traditional computer. For example, a die can be packaged with an embodiment of the stress-compensation layer configuration, and placed in a portable device such as a wireless communicator or a hand-held device such as a personal data assistant and the like. Another example is a die that can be packaged with an embodiment of the stress-compensation layer configuration and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
  pressing an electrical bump against a film, wherein the electrical bump is disposed on a substrate; and forming a stress-compensation layer against the electrical bump, the substrate, and the film, wherein pressing an electrical bump against a film includes embedding the electrical bump in the film in a range from about 5% embedded to about 95% embedded.

2. The process of claim 1, further including removing the film.

3. The process of claim 1, wherein removing the film at least partially exposes the electrical bump.

4. The process of claim 1, wherein forming a stress-compensation layer includes a process selected from capillary underfill, vacuum-assisted capillary underfill, positive-pressure assisted capillary underfill, and injection molding underfill.

5. The process of claim 1, wherein forming a stress-compensation layer includes a process of forming a particulate-containing stress-compensation layer.

6. The process of claim 1, further including curing the stress-compensation layer, selected from ultraviolet curing, microwave curing, thermal curing, chemical curing, timed curing, and combinations thereof.

7. The process of claim 1, further including:
curing the stress-compensation layer; and
coupling the electrical bump with an electrical contact.

8. A process comprising:
pressing an electrical bump against a film, wherein the electrical bump is disposed on a substrate;
forming a stress-compensation layer against the electrical bump, the substrate, and the film
curing the stress-compensation layer; and
coupling the electrical bump with an electrical contact, wherein curing the stress-compensation layer follows coupling the electrical bump.

9. A process comprising:
pressing an electrical bump in a ball grid array disposed on a substrate against a compressible film under conditions to at least partially embed the electrical bump into the compressible film;
forming a stress-compensation layer between the substrate and the compressible film; and
removing the compressible film.

10. The process of claim 9, further including curing the stress-compensation layer.

11. The process of claim 9, further including curing the stress-compensation layer, selected from ultraviolet curing, microwave curing, thermal curing, chemical curing, timed curing, and combinations thereof.

12. The process of claim 9, wherein pressing an electrical bump includes embedding the electrical bump in the compressible film in a range from about 10% embedded to about 90% embedded.

13. The process of claim 9, wherein forming a stress-compensation layer includes a process selected from capillary underfill, vacuum-assisted capillary underfill, positive-pressure assisted capillary underfill, and injection molding compound underfill.

14. The process of claim 9, wherein forming a stress-compensation layer includes a process selected from capillary underfill, vacuum-assisted capillary underfill, positive-pressure assisted capillary underfill, and injection molding compound underfill, the process further including:
curing the stress-compensation layer, selected from ultraviolet curing, microwave curing, thermal curing, chemical curing, timed curing, and combinations thereof.

15. The process of claim 9, wherein forming a stress-compensation layer includes a process of forming a particulate-containing stress-compensation layer.

16. The process of claim 9, further including pushing the electrical bump into an uncured polymer spot that is disposed upon a board.

17. A process comprising:
pressing an electrical bump against a film, wherein the electrical bump is disposed on a substrate;
forming a stress-compensation layer against the electrical bump, the substrate, and the film; and
pushing the electrical bump into an uncured polymer spot that is disposed upon a board.

18. A process comprising:
pressing a flexible film with a press plate against an electrical bump, wherein the electrical bump is disposed on a substrate; and
flowing a stress-compensation layer precursor material between the flexible film and the substrate to form a stress-compensation layer against the electrical bump, the substrate, and the film.

19. The process of claim 18, wherein pressing the flexible film with a press plate includes a press plate with a plate extension to form a mold chase between the flexible film and the substrate.

20. The process of claim 18, further including placing the substrate above and on a jig, followed by pressing the flexible film.

21. The process of claim 18, wherein flowing a stress-compensation layer precursor material includes injection molding a material selected from a resin, an epoxy, a cyanate ester, a polyimide, a polybenzoxazole, a polybenzimidazole, a polybenzothiazole, and combinations thereof.

22. The process of claim 18, further including:
first heating the stress-compensation layer precursor material to a temperature range from about 100° C. to about 140° C.; and
second holding the stress-compensation layer precursor material for a time from about 10 seconds to about 30 minutes.

23. The process of claim 18, further including:
first heating the stress-compensation layer precursor material to a temperature range from about 100° C. to about 140° C.;
second holding the stress-compensation layer precursor material for a time from about 10 seconds to about 30 minutes;
removing the film; and followed by
pushing the electrical bump into an uncured polymer spot that is disposed upon a board.

24. The process of claim 18, further including pushing the electrical bump into an uncured polymer spot that is disposed upon a board.

25. A process comprising:
pressing an electrical bump in a ball grid array disposed on a substrate, with a press plate against a compressible film under conditions to at least partially embed the electrical bump into the compressible film;
injection molding a stress-compensation layer between the substrate and the compressible film;
reflowing the electrical bump; followed by
first heating the stress-compensation layer precursor material to a temperature range from about 100° C. to about 140° C.;
second holding the stress-compensation layer precursor material for a time from about 10 seconds to about 30 minutes; and
removing the compressible film.

26. The process of claim 25, further including placing the substrate above and on a jig, followed by pressing the flexible film.

27. The process of claim 25, wherein injection molding a stress-compensation layer includes a process of forming a particulate-containing stress-compensation layer.

28. The process of claim 25, further including pushing the electrical bump into an uncured polymer spot that is disposed upon a board.

29. The process of claim 25, wherein injection molding a stress-compensation layer includes a process of forming a particulate-containing stress-compensation layer, the process further including:

placing the substrate above and on a jig, followed by pressing the flexible film; and after removing the flexible film pushing the electrical bump into an uncured polymer spot that is disposed upon a board.

* * * * *